US011145908B1

United States Patent
Deng et al.

(10) Patent No.: US 11,145,908 B1
(45) Date of Patent: Oct. 12, 2021

(54) LISTENING ONLY WIRELESS NETWORK CONTROLLER IN A WIRELESS BATTERY MANAGEMENT SYSTEM

(71) Applicant: Sensata Technologies, Inc., Attleboro, MA (US)

(72) Inventors: Jing Deng, Belfast (GB); Jonathan M. Rigelsford, Sheffield (GB); Stephen C. Millen, Coleraine (GB)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 17/217,976

(22) Filed: Mar. 30, 2021

Related U.S. Application Data

(60) Provisional application No. 63/003,647, filed on Apr. 1, 2020.

(51) Int. Cl.
| | |
|---|---|
| *G01N 27/416* | (2006.01) |
| *H01M 10/42* | (2006.01) |
| *G01R 31/367* | (2019.01) |
| *G01R 31/382* | (2019.01) |

(52) U.S. Cl.
CPC ...... *H01M 10/4207* (2013.01); *G01R 31/367* (2019.01); *G01R 31/382* (2019.01)

(58) Field of Classification Search
CPC .................................................. H01M 10/4207
USPC ......................................................... 324/426
See application file for complete search history.

(56) References Cited

U.S. PATENT DOCUMENTS

| | | | |
|---|---|---|---|
| 2003/0117112 A1* | 6/2003 | Chen | H02J 7/0071 320/137 |
| 2011/0133935 A1* | 6/2011 | Beltmann | A61B 5/7475 340/573.1 |
| 2011/0264318 A1* | 10/2011 | Laforge | G07C 5/008 701/22 |
| 2013/0099748 A1 | 4/2013 | Shimizu | |
| 2013/0271072 A1 | 10/2013 | Lee et al. | |
| 2018/0114389 A1 | 4/2018 | Geiszler | |
| 2019/0126775 A1* | 5/2019 | Han | B60L 58/13 |
| 2019/0140470 A1 | 5/2019 | Wan et al. | |

OTHER PUBLICATIONS

International Search Report and Written Opinion issued in International Application Serial No. PCT/US21/24967 dated Jun. 21, 2021.

* cited by examiner

*Primary Examiner* — Yalkew Fantu
(74) *Attorney, Agent, or Firm* — Mark H. Whittenberger; Holland & Knight LLP

(57) ABSTRACT

Methods and apparatuses for a listening only wireless network controller in a wireless battery management system are disclosed. A primary wireless network controller (WNC) receives battery sensor data from a plurality of module monitoring systems (MMSs). A secondary WNC also receives the battery sensor data from the MMSs. The secondary WNC is listening-only, in that it does not send commands to the MMSs. The listening-only WNC may be used to collect and provide redundant data for communication integrity or enhanced data for performance and diagnostic purposes. A collection of listening-only WNCs may be used to map locations of MMSs based on signal strength.

16 Claims, 8 Drawing Sheets

| Implement, in a first wireless network controller (WNC) of the BMS, bidirectional communication with one or more module monitoring systems (MMSs), wherein each MMS is associated with at least one battery module 702 |

| Implement, in a second WNC of the BMS, unidirectional communication with the one or more MMSs, wherein the second WNC receives data from the one or more MMSs 704 |

| Receive, by the first WNC, battery sensor data from the one or more MMSs 706 |

| Receive, by the second WNC, the same battery sensor data from the one or more MMSs 708 |

FIG. 7

Receive, by a plurality of wireless network controllers (WNCs) disposed outside of a battery pack, a signal from a plurality of module monitoring systems (MMSs) disposed inside the battery pack, wherein each MMS is associated with at least one battery cell 802

Identify, by a controller in dependence upon RSSI information received from each WNC, a location of each MMS within the battery pack 804

FIG. 8

LISTENING ONLY WIRELESS NETWORK CONTROLLER IN A WIRELESS BATTERY MANAGEMENT SYSTEM

RELATED APPLICATIONS

This application claims the benefit of, and incorporates by reference fully, U.S. Provisional Patent Application 63/003,647 filed on Apr. 1, 2020.

TECHNICAL FIELD

The present disclosure relates to battery management systems. More particularly, this disclosure relates to a "listening only" wireless protocol for battery management systems.

BACKGROUND

Electric vehicles are powered by high voltage battery systems including multiple cells. Battery management systems are used to monitor various attributes of the cells, including voltage, temperature, and current, in order to ensure proper and safe operation of the battery. In a conventional wired battery management system, multiple cells of the battery are grouped into modules, with each module having a component to monitor these attributes. Each of these components is wired to a central controller. Problems caused by this solution include lack of flexibility in pack design, wasted space due to connectors and cabling inside the battery pack, and increased challenges for battery life usage. Though wireless technologies may be used to connect battery monitoring components to a central controller, useful data may be lost while converting the wireless data to a format suitable for a vehicle controller bus. Furthermore, conventional wireless controllers are prone to losing data transmitted by battery monitoring components due to poor signal quality. Still further, there is a need to improve the process for mapping the logical location of modules within a battery pack during assembly.

SUMMARY

The following summary is meant to help one skilled in the art understand the various presently disclosed combinations of features. It is not meant to unduly limit the scope of any pending or future related claims relating to the disclosure.

Various embodiments are directed to utilizing a listening only wireless network controller in a wireless battery management system. In a battery management system, a plurality of module monitoring systems may be each configured to monitor various attributes of a battery module. These attributes may be encoded as battery sensor data. Each module monitoring system then transmits its battery sensor data over a bidirectional wireless communication channel to a wireless network controller. The wireless network controller may then format the battery sensor data and provide the formatted battery sensor data to a vehicle control system or a battery management system (BMS) controller. A second "listening only" wireless network controller may be used to expand the functionality of the battery management system, implement a redundant data system, and provide diagnostic information. The "listening only" wireless network controller receives battery sensor data from the module monitoring systems over a unidirectional communication channel. Multiple "listening only" wireless network controllers may also be used in a production line to identify the location of module monitoring systems in a battery pack.

According to an embodiment, a battery management system comprises a plurality of module monitoring systems configured to monitor a corresponding battery module of a plurality of battery modules; a first wireless network controller configured for bidirectional communication with the plurality of module monitoring systems, and a second wireless network controller configured for unidirectional communication with the plurality of module monitoring systems. The plurality of module monitoring systems sends the battery sensor data and integrity data to the first wireless network controller, and the first wireless network controller is configured to send the battery sensor data to a vehicle control system. The plurality of module monitoring systems sends the battery sensor data and integrity data to the second wireless network controller, wherein the second wireless network controller is configured to convert the battery sensor data to CAN flexible data-rate (FD) protocol for system performance analysis.

According to another embodiment, a wireless battery management system comprises a battery pack with a plurality of electrically interconnected cells; a plurality of battery modules, wherein each battery module is associated with a corresponding subset of cells; one or more module monitoring systems, wherein each module monitoring system is associated with at least one battery module. The module monitoring systems comprise at least one sensor for measuring battery characteristic data of the corresponding battery modules; a controller communicatively coupled to memory; and a wireless transceiver. The module monitoring systems are configured to encode the battery characteristic data and wirelessly transmit the battery characteristic data to a first wireless network controller and a second wireless network controller. The first wireless network controller is configured for bidirectional communication with the module monitoring systems and is further configured to receive battery characteristic data from the module monitoring systems. The second wireless network controller is configured for unidirectional communication with the module monitoring systems. The second wireless network controller receives a sync message from the first wireless network controller and, based on the received sync message, receives the same battery sensor data from the module monitoring systems. The second wireless network controller is further configured to convert the battery sensor data to CAN flexible data-rate (FD) protocol for system performance analysis.

According to another embodiment, a method for a battery management system comprises generating, by one or more module monitoring systems, battery sensor data and integrity data; and sending, by the module monitoring systems, the battery sensor data and integrity data to a first wireless network controller, the first wireless network controller configured for bidirectional communications with the module monitoring systems. The module monitoring systems send the same battery sensor data and integrity data to a second wireless network controller configured for unidirectional communication with the module monitoring systems.

In another embodiment, a battery module identification system comprises a battery pack with a plurality of battery cells; one or more module monitoring systems associated with at least one battery cell. A first wireless network controller is configured for bidirectional communication with the one or more module monitoring systems, and a plurality of second wireless network controllers disposed outside of the battery pack are configured for unidirectional communication with the one or more module monitoring systems. Each second wireless network controller is configured to receive a module monitoring systems identifier from each module monitoring systems and to determine a received signal strength indicator (RSSI) information associated with each module monitoring systems. A controller is configured to receive the module monitoring systems identifier associated with each module monitoring systems and the RSSI information determined by each second wireless network controller, wherein the controller is further configured to map the physical location of each module monitoring systems based on the module monitoring systems identifier and RSSI information.

According to another embodiment, a method for battery module identification comprises receiving, by a plurality of wireless network controllers disposed outside of a battery pack, a signal from a plurality of module monitoring systems disposed inside the battery pack, wherein each module monitoring systems is associated with at least one battery cell; and identifying, by a controller in dependence upon RSSI information received from each, a location of each module monitoring systems within the battery pack.

In one example embodiment, one or more module monitoring systems is associated with at least one battery module and a first wireless network controller is configured for bidirectional communication with the one or more module monitoring systems. A second wireless network controller is configured for unidirectional communication with the one or more module monitoring systems, such that the second wireless network controller receives the same data from the one or more module monitoring systems that is received by the first wireless network controller. The first wireless network controller provides data formatted for the vehicle control bus to the battery management system controller. In an embodiment, the second wireless network controller sends a richer set of data for performance evaluation to a diagnostic device. In another embodiment, the second wireless network controller sends a redundant set of data to the primary wireless network controller or to the battery management system controller.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 7 is a flowchart to illustrate an implementation of a method for a listening only wireless network controller in a wireless battery management system in accordance with the present disclosure; and FIG. 8 is a flowchart to illustrate another implementation of a method for a listening only wireless network controller in a wireless battery management system in accordance with the present disclosure.

DETAILED DESCRIPTION

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B, as well as A and B. An alternative wording for the same combinations is "at least one of A and B". The same applies for combinations of more than two elements.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

Exemplary methods, systems, apparatuses, and computer program products for a listening only wireless network controller in a wireless battery management system in accordance with the present disclosure are described with reference to the accompanying drawings, beginning with FIG. 1.

Figure 1:
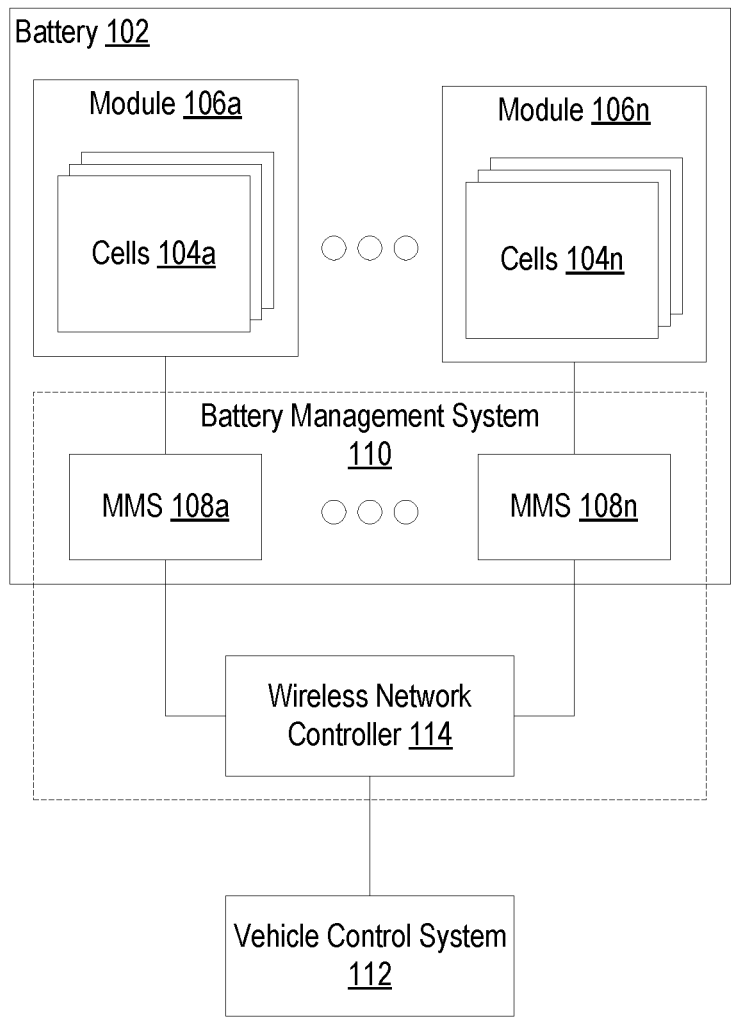
FIG. 1 sets forth a block diagram of a system for a listening only wireless network controller in a wireless battery management system according to embodiments of the present disclosure.

FIG. 1 sets forth a diagram of a system for a listening only wireless network controller in a wireless battery management system according to embodiments of the present disclosure. The system includes a battery (102), such as a high voltage battery for use in an electric vehicle. The battery (102) includes a plurality of cells (104a-n), such as Lithium-ion (Li-ion) cells. The cells (104a-n) are grouped into modules (106a-n) such that each module (106a-n)

comprises a corresponding subset of the cells (104a-n). The cells (104a-n) may be physically grouped into modules (106a-n) using a casing, chassis, or other enclosure. The cells (104a-n) may also be logically grouped into modules (106a-n) by virtue of distinct groupings of cells (104a-n) being monitored by a distinct module monitoring system (108a-n), as will be described below.

The system also includes a battery management system (110). The battery management system (110) monitors various attributes of the cells (104a-n) and provides battery sensor data indicating these attributes to a vehicle control system (112). The battery management system (110) includes a plurality of module monitoring systems (MMS) (108a-n). Each MMS (108a-n) is configured to monitor a corresponding module (106a-n) of cells (104a-n). For example, each module (106a-n) may have a MMS (108a-n) attached to a chassis, base, tray, or other mechanism holding the cells (104a-n) of the module (106a-n). Each MMS (108a-n) includes sensors to measure various attributes of the cells (104a-n) of its corresponding module (106a-n). Such attributes may include voltage, current, temperature, and potentially other attributes. The attributes are indicated in battery sensor data generated by the MMS (108a-n). Each MMS (108a-n) is configured to operate at a particular Automotive Safety Integrity Level (ASIL), such as ASIL-D. As an example, each MMS (108a-n) may be configured to meet, at minimum, ASIL-QM standards, allowing for reduced cost and complexity.

Each MMS (108a-n) encodes its battery sensor data for transmission as a wireless signal and transmits its battery sensor data using a wireless communication channel to a wireless network controller (WNC) (114) (e.g., a 2.4 Ghz wireless channel). The WNC (114) may be implemented using a wireless transceiver integrated circuit for reduced cost and complexity. According to some embodiments, the wireless communication channel may have no intervening components between the MMS (108a-n) and WNC (114), preventing faults from being introduced into the battery sensor data from an intermediary communications component. The WNC (114) then sends the battery sensor data received from the MMSs (108a-n) to a vehicle control system (VCS) (112) using a wired or wireless communications channel. The VCS (112) may include a central "computer" of a vehicle. The VCS (112) may be a central control unit or may refer collectively to one or more vehicle subsystems. In an embodiment, the VCS (112) includes a battery management system controller (BMSC). The WNC (114) may communicate with the VCS (112), for example, over a controller area network (CAN) bus or a serial peripheral interface (SPI) bus. The WNC (114) may include a universal asynchronous receiver/transmitter (UART) for communicating with the VCS (112).

To ensure the security and integrity of wireless communications between the MMS (108a-n) and WNC (114), each MMS (108a-n) generates one or more portions of integrity data for the battery sensor data prior to sending to the WNC (114). The integrity data is sent with the battery sensor data to the WNC (114) (e.g., as a header or separate portion of a data payload). The WNC (114) may then validate received battery sensor data using the integrity data. The integrity data may include a message authentication code for the battery sensor data. The message authentication code may be generated by a key together with the sensor data. For example, each MMS (108a-n) may share a same key, or each have distinct keys for generating a message authentication code. The WNC (114) may then generate a message authentication code based on the battery sensor data using the appropriate key and compare the generated message authentication code to the received message authentication code. The integrity data may include an identifier associated with the MMS (108a-n) generating the battery sensor data. The identifier may include a user-defined identifier, serial number, or other unique identifier for a particular MMS (108a-n). The WNC (114) may validate the battery sensor data by comparing the identifier to one or more known identifiers for each MMS (108a-n).

Figure 2:
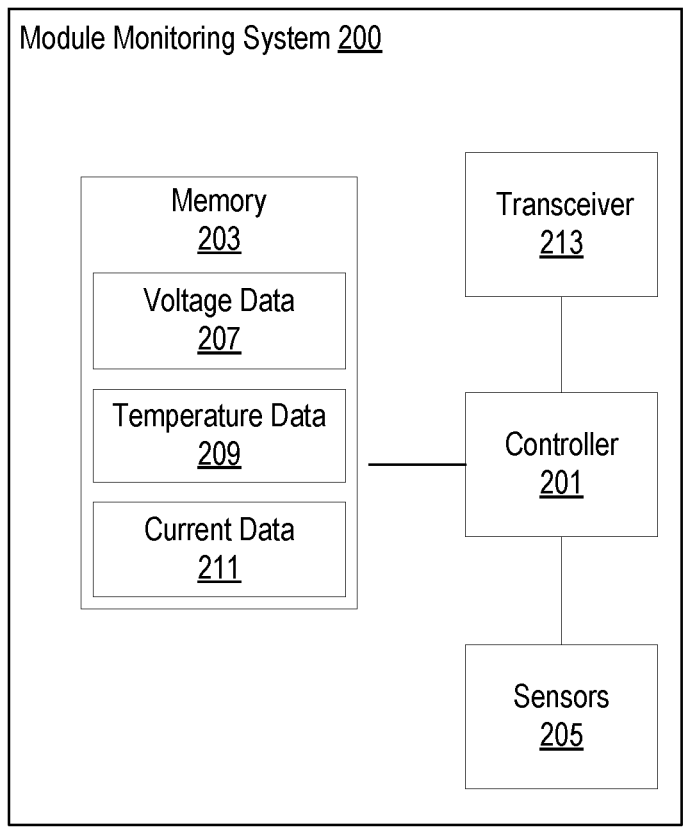
FIG. 2 illustrates a block diagram of a module monitoring system in a wireless battery management system according to embodiments of the present disclosure.

For further explanation, FIG. 2 sets forth a block diagram of a module monitoring system (MMS) (200) (e.g., a module monitoring system (108a-n) of FIG. 1) in a wireless battery management system according to embodiments of the present disclosure. The MMS (200) includes a controller (201) coupled to a memory (203). The controller (201) is configured to obtain sensor readings from sensors (205) (e.g., voltage sensors, temperature sensors, current sensors) to generate battery sensor data (e.g., voltage data (207), temperature data (209), current data (211)). The controller (201) may include or implement a microcontroller, an Application Specific Integrated Circuit (ASIC), a digital signal processor (DSP), a programmable logic array (PLA) such as a field programmable gate array (FPGA), or other data computation unit in accordance with the present disclosure. The battery sensor data (e.g., voltage data (207), temperature data (209), current data (211)) may be stored in the memory (203). The memory (203) may be a non-volatile memory such as flash memory.

The sensors (205) are configured to measure attributes (e.g., voltage, temperature, current) of cells of a module (e.g., cells (104a-n) of a module (106a-n)) on which the MMS (200) is installed. For bidirectional wireless communication with a wireless network controller (e.g., a WNC (114) of FIG. 1), the MMS (200) includes a transceiver (213) coupled to the controller (201).

Figure 3:
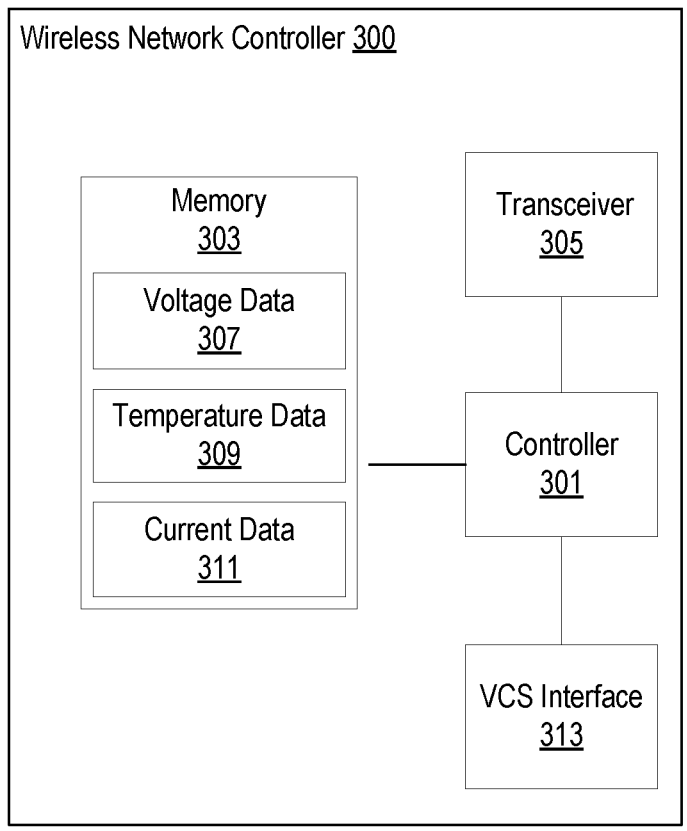
FIG. 3 illustrates a block diagram of a wireless network controller in a wireless battery management system according to embodiments of the present disclosure.

For further explanation, FIG. 3 sets forth a block diagram of a wireless network controller (WNC) (300) (e.g., a wireless network controller (114) of FIG. 1) for a listening only wireless network controller in a wireless battery management system according to embodiments of the present disclosure. The WNC (300) includes a controller (301) coupled to a memory (303). The controller (301) is configured to request and receive, via a transceiver (305) from a plurality of MMSs (200), sensor data (e.g., voltage data (307), temperature data (309), current data (311)). The controller (301) may include or implement a microcontroller, an Application Specific Integrated Circuit (ASIC), a digital signal processor (DSP), a programmable logic array (PLA) such as a field programmable gate array (FPGA), or other data computation unit in accordance with the present disclosure. The battery sensor data (e.g., voltage data (307), temperature data (309), current data (311)) may be stored in the memory (303). The memory (303) may be a non-volatile memory such as flash memory. The controller (301) is further configured to provide formatted battery sensor data to a vehicle control system (e.g., a VCS (112) of FIG. 1) via a VCS interface (313). The VCS interface may include a bus or other wired connection to a VCS.

Figure 4:
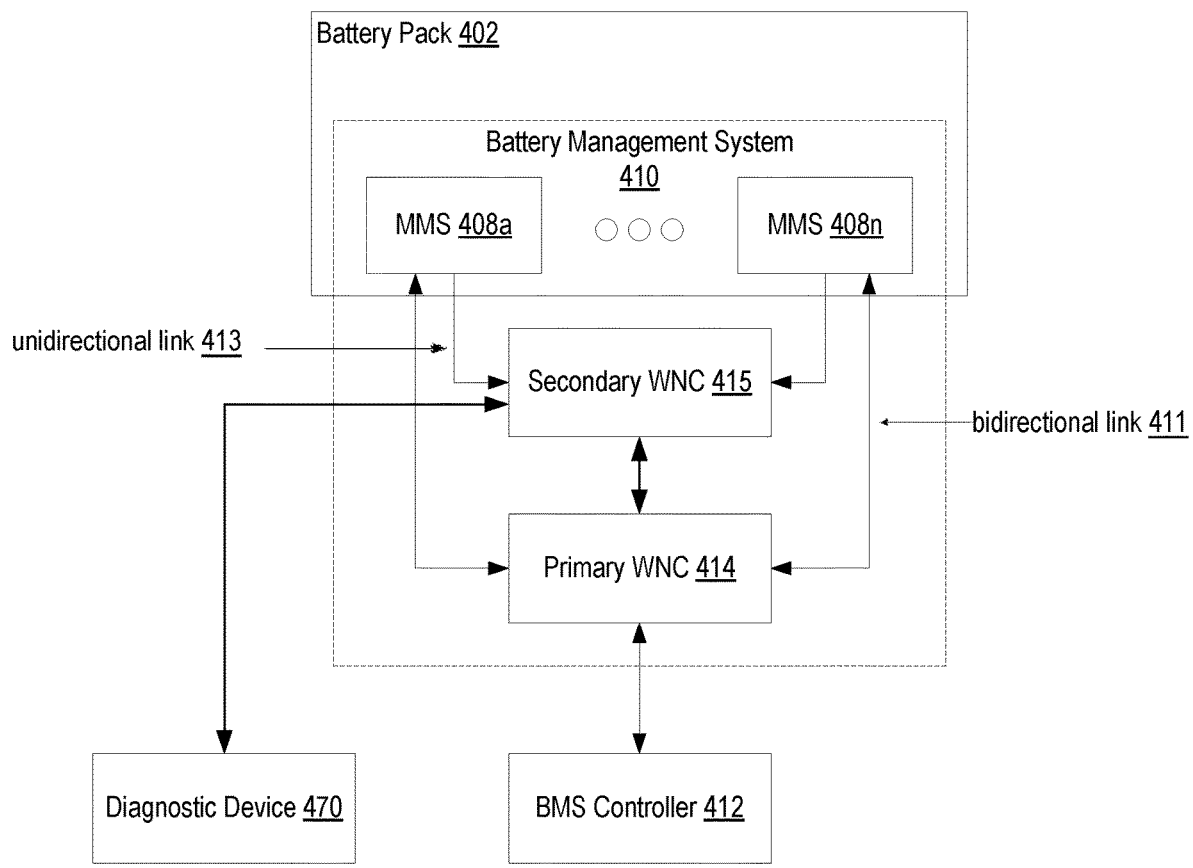
FIG. 4 illustrates a block diagram of another example system for a listening only wireless network controller in a wireless battery management system in accordance with the present disclosure.

For further explanation, FIG. 4 sets forth a block diagram of a system (400) for a listening only wireless network controller in a wireless battery management system according to embodiments of the present disclosure. The system (400) includes a battery management system (410) for a battery pack (402), the battery management system (410) including a plurality of MMSs (408a-n) (e.g. the MMS (200) of FIG. 2) communicatively coupled to a primary WNC (414) (e.g., the WNC (300) of FIG. 3) through a bidirectional wireless communication link (411). The primary WNC (414) receives battery sensor data from the MMSs (408a-n) and formats the data for communication to a BMS controller (412). For example, the primary WNC (414) may format the data according to a communication protocol of, for example, a CAN bus or an SPI bus. The primary WNC (414) may also format the data for communication via a UART. The battery management system (410) also includes a secondary WNC (415) that is a "listening only" WNC in that it also receives the same battery sensor data that the primary WNC (414) receives but does not transmit requests, instructions, or other data to the MMSs (408a-n). The secondary WNC (415) receives battery sensor data from the MMSs (408a-n) over a unidirectional communication link (413). The secondary WNC (415) is configured to format battery sensor data in accordance with a CAN flexible data-rate (FD) protocol for providing rich data for system debugging and performance analysis to, for example, a diagnostic device (470). The secondary WNC (415) receives a sync message from the primary WNC (414) and switches to the correct frequency to receive data from MMSs (408a-n). The secondary WNC (415) may provide spatial, frequency and polarization diversity from the primary WNC (414). The secondary WNC (415) is also configured with the security keys from each MMS (408a-n) so that the received data can be correctly decrypted.

Figure 5:
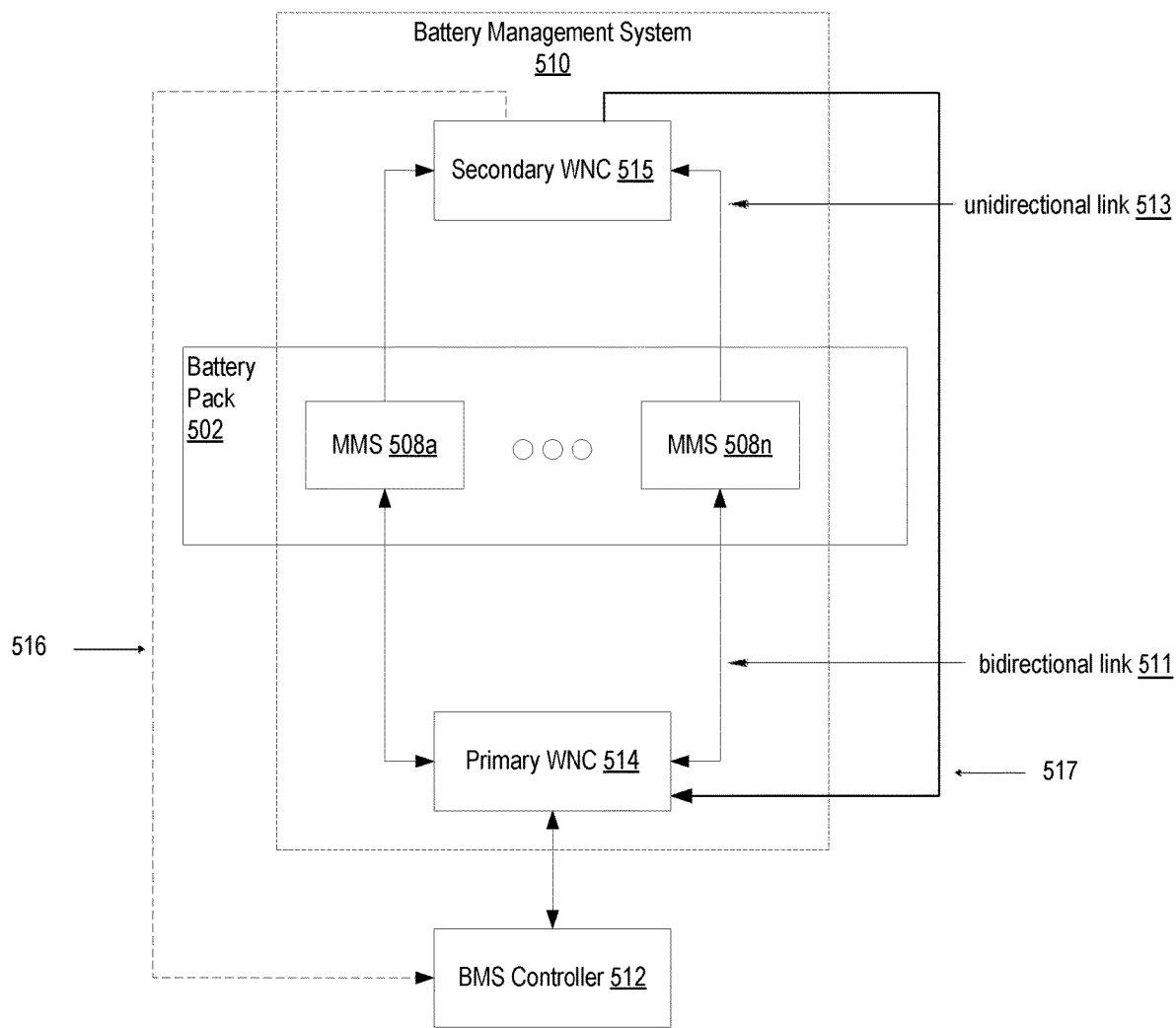
FIG. 5 illustrates a block diagram of another example system for a listening only wireless network controller in a wireless battery management system in accordance with the present disclosure.

For further explanation, FIG. 5 sets forth a block diagram of a system (500) for a listening only wireless network controller in a wireless battery management system according to embodiments of the present disclosure. The system (500) includes a battery management system (510) including a battery pack (502) that includes a plurality of MMSs (508a-n) (e.g. the MMS (200) of FIG. 2) communicatively coupled to a primary WNC (514) (e.g., the WNC (300) of FIG. 3) through a bidirectional wireless communication link (511). The primary WNC (514) receives battery sensor data from the MMSs (508a-n) and formats the data for communication to a BMS controller (512). For example, the primary WNC (514) may format the data according to a communication protocol of, for example, a CAN bus or an SPI bus. The primary WNC (514) may also format the data for communication via a UART. The battery management system (510) also includes a secondary WNC (515) that is a "listening only" WNC in that it also receives the same battery sensor data that the primary WNC (514) receives but does not transmit requests, instructions, or other data to the MMSs (508a-n). The secondary WNC (515) receives battery sensor data from the MMSs (508a-n) over a unidirectional wireless communications link (513). The secondary WNC (515) is configured to provide redundant battery sensory data from the MMSs (508a-n).

For example, the secondary WNC (515) may be positioned in a location to receive battery sensor data from the MMSs (508a-n) that may be lost or otherwise not received by the primary WNC (514) due to poor signal strength. This secondary WNC (515) is configured with the same subnet ID as the wireless network of the primary WNC (514) and the MMSs (508a-n) and synchronizes with the whole network through a sync frame sent by the primary WNC (514). The secondary WNC (515) may also be configured with required security keys to properly decrypt the data received from MMSs (508a-n). In such configuration, the data sent by each MMS (508a-n) is received by both WNCs (514, 515) at the same time, or substantially the same time. If the data packet was lost while sending to the primary WNC (514), the lost packet could still be received by the secondary WNC (515), leading to significantly improved wireless network performance. Battery sensor data from secondary WNC (515) can be sent to either a BMS controller (512) via a CAN bus or SPI bus (or using a UART) (516) or to the primary WNC (514) via a CAN bus (517) to be merged with battery sensor data received by the primary WNC (514). In an embodiment, battery sensor data received by the secondary WNC (515) and transmitted to the primary WNC (514) may be sent in accordance with CAN FD protocol.

Figure 6:
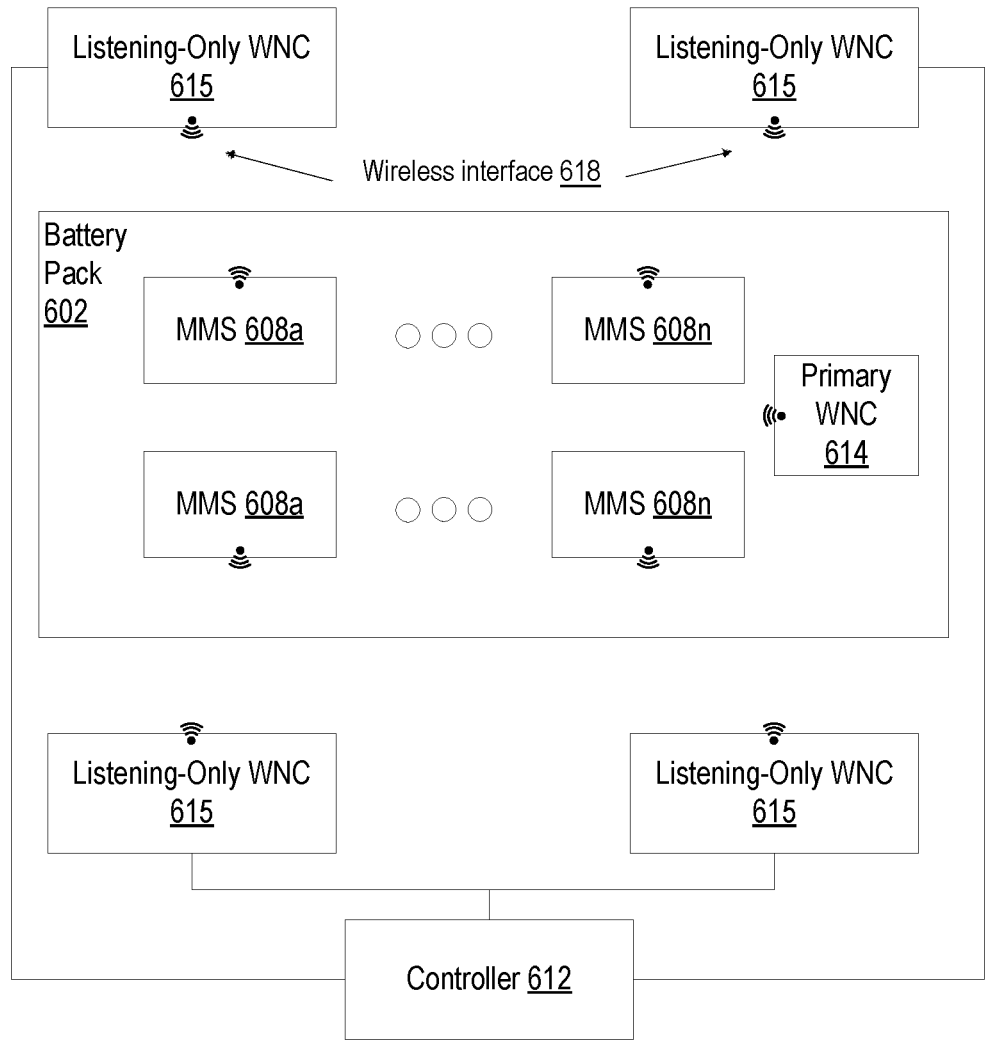
FIG. 6 illustrates a block diagram of another example system for a listening only wireless network controller in a wireless battery management system in accordance with the present disclosure.

For further explanation, FIG. 6 sets forth a block diagram of a system (600) for a listening only wireless network controller in a wireless battery management system according to embodiments of the present disclosure. The system (600) includes a battery pack (602) (e.g., the battery pack (102) of FIG. 1) in a battery pack production line. The battery pack (602) includes a plurality of MMSs (608a-n) and a primary WNC (614). The system (600) further includes a plurality of secondary "listening only" WNCs (615). The secondary WNCs (615) are "listening only" WNCs in that they receive communication from the MMSs (608a-n) through a wireless interface (618) but do not transmit requests, instructions, or other data to the MMSs (608a-n). The system (600) further include a controller (612) for analyzing the information collected by each listening only WNC (615). The secondary WNCs (615) transmit the information collected to the controller 612, and such transmission can be in accordance with CAN FD protocol.

On the battery pack assembly line, it is beneficial to correctly configure the MMS node ID to match the module in-pack logical location (from most negative to most positive or vice versa). Although manual check or automatic bar code scanning can be deployed to verify the node ID configuration. The process still takes significant time which is not preferred in a fast production environment. As each MMS (608a-n) has the wireless interface (618), the listening only WNCs (615) are fitted to the production line to receive data from each MMS (608a-n). The listening only WNCs (615) are automatically configured with the same network subnet ID as the WNC (614) of the battery pack (602), and the receiving frequency is synchronized with a battery pack communication network. Additionally, there is no need to decrypt the data from each MMS (608a-n), thus obviating the need for a complicated and secure key sharing mechanism. The wireless protocol is designed to send MMS node IDs and subnet ID as plain text in the RF frames. Therefore, based on a received signal strength indicator (RSSI) and node ID received by each listening only WNC (615), a map of the MMSs (608a-n) can be generated for the battery pack (602). This map may then be used to verify the logic location of each MMS (608a-n).

For further explanation, FIG. 7 sets forth a flow chart illustrating an exemplary method for a listening only wireless network controller in a wireless battery management system according to embodiments of the present disclosure that includes implementing (702), in a first wireless network controller (WNC) of the BMS, bidirectional communication with one or more module monitoring systems (MMSs), wherein each MMS is associated with at least one battery module. Implementing (702), in a first wireless network controller (WNC) of the BMS, bidirectional communication with one or more module monitoring systems (MMSs), wherein each MMS is associated with at least one battery module, may be carried out by a primary WNC (e.g. the primary WNC (414) of FIG. 4) sending requests and/or instructions to one or more MMSs (e.g., MMSs (408a-n)) and receiving battery sensory data from the one or more MMSs in a battery management system (e.g., the BMS (410)

of FIG. 4). The battery sensor data may include current, temperature, voltage, or other attributes of a battery cell.

The method of FIG. 7 further includes implementing (704), in a second WNC of the BMS, unidirectional communication with the one or more MMSs, wherein the second WNC receives data from the one or more MMSs. Implementing (704), in a second WNC of the BMS, unidirectional communication with the one or more MMSs, wherein the second WNC receives data from the one or more MMSs, may be carried out by a secondary "listening only" WNC (e.g., the WNC (415) of FIG. 4) receiving battery sensory data from the one or more MMSs (e.g., the MMSs (408a-n) of FIG. 4). The secondary "listening only" WNC is different from the primary WNC in that the secondary WNC does not send requests or commands to the MMSs.

The method of FIG. 7 further includes receiving (706), by the first WNC, battery sensor data from the one or more MMSs. Receiving (706), by the first WNC, battery sensor data from the one or more MMSs may be carried out, for example, by the primary WNC (414) of FIG. 4 receiving battery sensor data from one or more MMSs (408a-n). For example, the received battery sensor data may be formatted for transmission to the BMS controller (412) utilizing a CAN bus, an SPI bus, or a UART.

The method of FIG. 7 further includes receiving (708), by the second WNC, the same battery sensor data from the one or more MMSs. Receiving (708), by the second WNC, the same battery sensor data from the one or more MMSs may be carried out, for example, by the secondary WNC (415) of FIG. 4 receiving the same battery sensor data from one or more MMSs (408a-n) that is received by the primary WNC (414). For example, the received battery sensor data may be formatted for transmission to a diagnostic device utilizing a CAN FD network, wherein the data transmitted over the CAN FD is a richer set of data than the data transmitted by the primary WNC (414). As another example, the received battery sensor data may be provided to the BMS controller (412) or the primary WNC (414) as redundant data.

For further explanation, FIG. 8 sets forth a flow chart illustrating an exemplary method for a listening only wireless network controller in a wireless battery management system according to embodiments of the present disclosure that includes receiving (802), by a plurality of wireless network controllers (WNCs) disposed outside of a battery pack, a signal from a plurality of module monitoring systems (MMSs) disposed inside the battery pack, wherein each MMS is associated with at least one battery cell. Receiving (802), by a plurality of wireless network controllers (WNCs) disposed outside of a battery pack, a signal from a plurality of module monitoring systems (MMSs) disposed inside the battery pack, wherein each MMS is associated with at least one battery cell may be carried out, for example, by the plurality of listening only WNCs (615) of FIG. 6 receiving RSSI information and an MMS identifier from each MMS (608a-n) in the battery pack (602).

The method of FIG. 8 also includes identifying (804), by a controller in dependence upon RSSI information received from each WNC, a location of each MMS within the battery pack. Identifying (804), by a controller in dependence upon RSSI information received from each WNC, a location of each MMS within the battery pack may be carried out, for example, by the controller (612) receiving the RSSI information and MMS identifier information collected by each WNC (615) and mapping, based on the RSSI information and MMS identifiers, the logical location of each MMS (608a-n) in the battery pack (602).

In view of the explanations set forth above, readers will recognize that the benefits of a listening only wireless network controller in a wireless battery management system according to embodiments of the present disclosure may include, but are not limited to:

Improved system debugging and performance analysis resulting from the ability of the listening only WNC to receive data from all MMSs and convert the RF data to rich CAN FD data.

Improved wireless network performance when a lost data packet transmitted to the primary WNC is received by the second listening only WNC.

Improved verification MMS in-pack logic location using listening only WNCs to map MMS location based on signal strength information and the MMS identifier.

Exemplary embodiments of the present invention are described largely in the context of a fully functional computer system for a listening only wireless network controller in a wireless battery management system. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, an apparatus, a method, and/or a computer program product. The computer program product may include a computer readable storage medium (or media) having computer readable program instructions thereon for causing a processor to carry out aspects of the present invention.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A battery management system (BMS) comprising:
a plurality of module monitoring systems each configured to monitor a corresponding battery module of a plurality of battery modules;
a first wireless network controller configured for bidirectional communication with the plurality of module monitoring systems;
a second wireless network controller configured for unidirectional communication with the plurality of module monitoring systems;
a vehicle control system;
wherein the battery management system is configured to perform steps comprising:

generating, by a module monitoring system of the plurality of module monitoring systems, battery sensor data;

generating, by the module monitoring system, based on the battery sensor data, integrity data;

sending, by the module monitoring system, the battery sensor data and integrity data to the first wireless network controller;

sending, by the module monitoring system, the battery sensor data and integrity data to the second wireless network controller;

wherein the first wireless network controller is configured to send the battery sensor data to the vehicle control system; and the second wireless network controller is configured to convert the battery sensor data to controller area network (CAN) flexible data-rate (FD) protocol for system performance analysis.

2. The battery management system of claim 1, furthering comprising a battery management system controller, wherein the first wireless network controller is configured for communication with the battery management system controller via at least one of a controller area network (CAN) bus, CAN FD network, a serial peripheral interface (SPI) bus, or a universal asynchronous transmitter/receiver (UART).

3. The battery management system of claim 1, wherein the second wireless network controller is configured to provide diagnostic data to an external device over the CAN FD network.

4. The battery management system of claim 1, wherein the second wireless network controller is configured to provide redundant battery sensor data to the first wireless network controller over the CAN FD network.

5. The battery management system of claim 2, wherein the second wireless network controller is configured to provide redundant data to the BMS controller via at least one of the CAN bus, CAN FD network, the SPI bus, or the UART.

6. The battery management system of claim 4, wherein the redundant battery sensor data from the second wireless network controller is merged with the battery sensor data from the first wireless network controller to become merged battery sensor data; the first wireless network controller being configured to send the merged battery sensor data to at least one of the vehicle control system or the BMS controller.

7. A wireless battery management system comprising:
a battery pack comprising a plurality of battery modules;
each of the plurality of battery modules comprising a plurality of cells;
one or more module monitoring systems, wherein each of the one or more module monitoring systems is connected with at least one of the plurality of battery modules;
the one or more module monitoring systems each comprising at least one sensor for measuring battery characteristic data of the battery modules, a memory unit communicatively coupled to a controller, and a wireless transceiver;
wherein the one or more module monitoring systems are each configured to encode the battery characteristic data and transmit the battery characteristic data to a first wireless network controller and a second wireless network controller;
the first wireless network controller configured for bidirectional communication with the one or more module monitoring systems, the first wireless network controller further configured to receive the battery characteristic data from the one or more module monitoring systems; and the second wireless network controller configured for unidirectional communication with the one or more module monitoring systems, wherein the second wireless network controller receives a sync message from the first wireless network controller and, based on the received sync message, receives the same battery sensor data from the one or more module monitoring systems, and, the second wireless network controller is further configured to convert the battery sensor data to controller area network CAN flexible data-rate (FD) protocol for system performance analysis.

8. The battery management system of claim 7, further comprising a battery management system controller, wherein the first wireless network controller is configured for communication with the battery management system controller via at least one of a controller area network (CAN) bus, CAN FD protocol, a serial peripheral interface (SPI) bus, or a universal asynchronous transmitter/receiver (UART).

9. The battery management system of claim 7, wherein the second wireless network controller is configured to provide diagnostic data to an external device via the CAN FD protocol.

10. The battery management system of claim 7, wherein the second wireless network controller is configured to provide redundant data to the first wireless network controller via a CAN FD network.

11. The battery management system of claim 8, wherein the second wireless network controller is configured to provide redundant data to the battery management system controller via at least one of the CAN bus, the CAN FD protocol, the SPI bus, or the UART.

12. A method for a battery management system, the method comprising:
generating, by one or more module monitoring systems of the battery management system, battery sensor data;
generating integrity data, by the one or more module monitoring systems, based on the battery sensor data;
sending, by the one or more module monitoring systems, the battery sensor data and the integrity data to a first wireless network controller; the first wireless network controller configured for bidirectional communication with the one or more module monitoring systems; and
sending, by the one or more module monitoring systems, the battery sensor data and the integrity data to a second wireless network controller, the second wireless network controller configured for unidirectional communication with the one or more module monitoring systems.

13. The method of claim 12, further comprising:
validating, by the first wireless network controller, based on the integrity data, the battery sensor data;
sending, by the first wireless network controller, the validated battery sensor data to a vehicle control system;
wherein the second wireless network controller converts the received battery sensor data to CAN flexible data-rich (FD) protocol for system performance analysis.

14. The method of claim 12, further comprising:
a battery management system controller, wherein the first wireless network controller sends the battery sensor data to the battery management system controller via at least one of a controller area network (CAN) bus, CAN FD protocol, a serial peripheral interface (SPI) bus, or a universal asynchronous transmitter/receiver (UART); and the second wireless network controller sends the battery sensor data to an external device over the CAN FD protocol for system debugging and performance analysis.

15. The method of claim 14, wherein the second wireless network controller sends redundant battery sensor data to the battery management system controller or the first wireless network controller, over the CAN FD protocol for improved wireless performance.

16. A battery module identification system comprising:
a battery pack comprising a plurality of battery cells;
one or more module monitoring systems, wherein each module monitoring systems is associated with at least one battery cell;
a first wireless network controller configured for bidirectional communication with the one or more module monitoring systems;
a plurality of second wireless network controllers disposed outside of the battery pack, the second wireless network controllers configured for unidirectional communication with the one or more module monitoring systems,
wherein each second wireless network controller is further configured to receive a module identifier from each module monitoring system and to determine received signal strength indicator (RSSI) information associated with each module monitoring system; and
a controller configured to receive, from the plurality of second wireless network controllers, the module identifiers associated with each module monitoring system and the RSSI information determined by each second wireless network controller;
the controller further configured to map the physical location of each module monitoring systems based on the module identifier and RSSI information.

* * * * *